United States Patent
Seo et al.

(10) Patent No.: US 7,462,899 B2
(45) Date of Patent: Dec. 9, 2008

(54) SEMICONDUCTOR MEMORY DEVICE HAVING LOCAL ETCH STOPPER AND METHOD OF MANUFACTURING THE SAME

(75) Inventors: Jung-woo Seo, Suwon-si (KR);
Jong-seo Hong, Yongin-si (KR);
Tae-hyuk Ahn, Yongin-si (KR);
Jeong-sic Jeon, Hwaseong-si (KR);
Jun-sik Hong, Yongin-si (KR);
Young-sun Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 187 days.

(21) Appl. No.: 11/354,175

(22) Filed: Feb. 15, 2006

(65) Prior Publication Data

US 2006/0186479 A1    Aug. 24, 2006

(30) Foreign Application Priority Data

Feb. 24, 2005    (KR) .................. 10-2005-0015371

(51) Int. Cl.
*H01L 27/108*    (2006.01)
(52) U.S. Cl. ................ 257/296; 438/303; 257/E29.125; 257/E21.626
(58) Field of Classification Search .................. 257/368, 257/296, E29.125, E21.626; 438/303
See application file for complete search history.

(56) References Cited

U.S. PATENT DOCUMENTS

| | | | | |
|---|---|---|---|---|
| 5,292,677 A | * | 3/1994 | Dennison | 438/396 |
| 5,608,249 A | * | 3/1997 | Gonzalez | 257/306 |
| 5,990,507 A | * | 11/1999 | Mochizuki et al. | 257/295 |
| 6,214,715 B1 | * | 4/2001 | Huang et al. | 438/597 |
| 6,545,306 B2 | * | 4/2003 | Kim et al. | 257/296 |
| 6,563,162 B2 | * | 5/2003 | Han et al. | 257/306 |
| 6,680,514 B1 | * | 1/2004 | Geffken et al. | 257/368 |
| 6,693,002 B2 | * | 2/2004 | Nakamura et al. | 438/238 |
| 6,787,906 B1 | | 9/2004 | Yang et al. | |
| 7,109,086 B2 | * | 9/2006 | Kammler et al. | 438/303 |
| 2002/0053690 A1 | * | 5/2002 | Kim et al. | 257/296 |
| 2002/0179948 A1 | * | 12/2002 | Lee | 257/296 |
| 2005/0142828 A1 | * | 6/2005 | Kammler et al. | 438/595 |

FOREIGN PATENT DOCUMENTS

| | | |
|---|---|---|
| KR | 1020010076938 | 8/2001 |
| KR | 1020020017448 | 3/2002 |
| KR | 1020040001923 | 1/2004 |

* cited by examiner

*Primary Examiner*—Quoc D Hoang
(74) *Attorney, Agent, or Firm*—Volentine & Whitt, PLLC (57) ABSTRACT

A semiconductor memory device includes a semiconductor substrate in which a cell region and a core and peripheral region are defined. The device further comprises isolation layers formed in the semiconductor substrate to define active regions, a first gate electrode structure formed in the cell region and a second gate electrode structure formed in the core and peripheral region. Source and drain regions formed in the active regions on respective sides of each of the gate electrode structures and self-aligned contact pads are formed in the cell region in contact with the source and drain regions. An insulating interlayer is formed on the semiconductor substrate between the self-aligned contact pads, and etch stoppers are formed on the insulating interlayer between the self-aligned contact pads in the cell region.

14 Claims, 7 Drawing Sheets

SEMICONDUCTOR MEMORY DEVICE HAVING LOCAL ETCH STOPPER AND METHOD OF MANUFACTURING THE SAME

BACKGROUND OF THE INVENTION

1. Field of the Invention

The present invention relates generally to a semiconductor memory device and a method of manufacturing the same. More particularly, the invention relates to a semiconductor memory device having an etch stopper formed in a cell region and a method of manufacturing the semiconductor memory device.

A claim of priority is made to Korean Patent Application No. 10-2005-0015371, filed on Feb. 24, 2005, the disclosure of which is hereby incorporated by reference in its entirety.

2. Description of Related Art

As the integration density of semiconductor memory devices increases, contact holes formed in the semiconductor devices become increasingly narrow. As a result, the aspect ratio of the contact holes tends to increase, and therefore contact holes and associated contacts are often required to be formed using multi-step processes.

The integration density of dynamic random access memory (DRAM) devices is typically very high. Because of this, active regions between adjacent gate electrodes in DRAMs are generally so narrow that it is difficult to form contacts connected to the active regions. One approach to forming contacts in narrow regions is to form a hard mask layer and spacers over and around the gate electrodes before forming self aligned contact pads between the gate electrodes. Then, bitline contacts or storage node contacts are formed over the self-aligned contact pads. This approach is often referred to as "self aligned contact technology."

Typically, the self-aligned contacts have a larger diameter than the bitline contacts or the storage node contacts. However, as the integration density of DRAM devices continues to increase, the diameter of the self-aligned contact pads reduces and approaches the diameter of the bitline and storage node contacts. As a result, slight misalignments between the bitline or storage node contacts and node can cause serious problems in the manufacture of DRAM devices. Illustrations of some common problems are described below in relation to FIG. 1.

Figure 1:
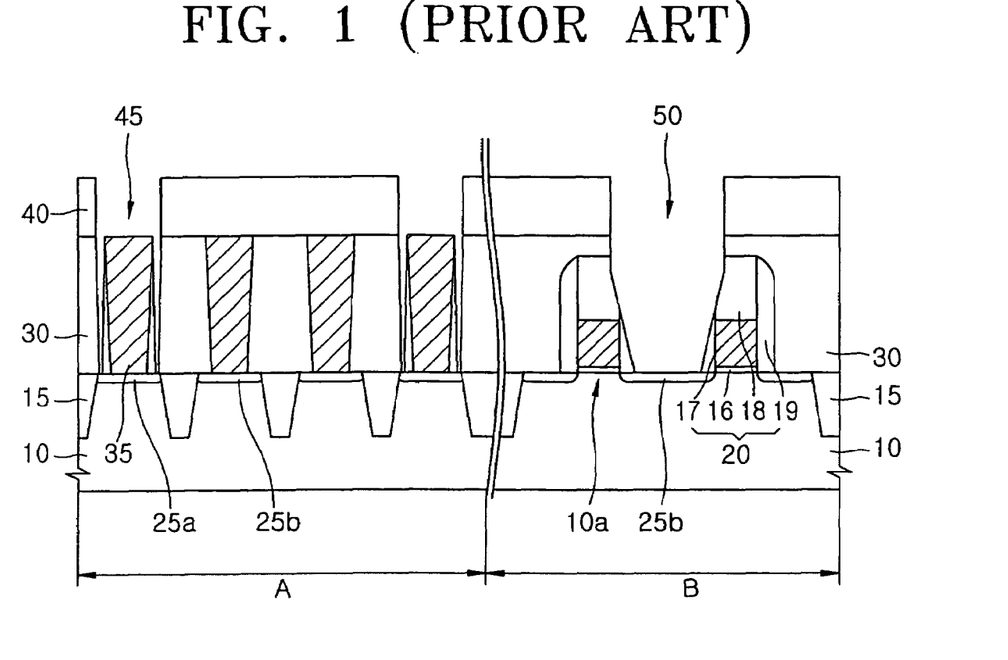
FIG. 1 is a cross-sectional view of a conventional semiconductor memory device.

Referring to FIG. 1, a conventional semiconductor memory device comprises a semiconductor substrate 10 in which a cell region "A" and a core and peripheral region "B" are defined. A plurality of isolation layers 15 defining active regions 10a are formed in semiconductor substrate 10, and junction regions 25a and 25b are formed between isolation layers 15 in respective cell and core and peripheral regions "A" and "B".

A first insulating interlayer 30 is formed over semiconductor substrate 10 and a second insulating interlayer 40 is formed over first insulating interlayer 30.

In cell region "A", a plurality of self-aligned contact pads 35 are formed in first insulating interlayer 30 over junction regions 25a, and a plurality of bitline contact holes 45 are formed in second insulating interlayer 40 to expose self-aligned contact pads 35.

In core and peripheral region "B", a gate electrode structure 20 is formed in first insulating layer 30 on side junction region 25b and an interconnection contact hole 50 is formed in first and second insulating interlayer 30 and 40 to expose side junction region 25b. Each gate electrode structure 20 comprises a gate insulating layer 16 formed on semiconductor substrate 10, a gate electrode material 17 formed on gate insulating layer 16, a hard mask layer 18 formed over gate electrode material 17, and spacers 19 formed on the sidewall of gate insulating layer 16, gate electrode material 17, and hard mask layer 18.

Typically, the respective diameters of self-aligned contact pads 35 and bitline contact holes 45 are slightly different from each other, or they are slightly misaligned with each other. As a result, portions of first insulating interlayer 30 adjacent to self-aligned contact pads 35 may be removed when bitline contact holes 45 are formed. Due to the partial loss of first insulating interlayer 30, active regions 10a may also be partially removed, causing leakage current in the semiconductor memory device.

Storage node contact holes (not shown) are typically formed after bitlines are formed in bitline contact holes 45. The storage node contact holes are generally formed between the bitlines to contact self-aligned contact pads 35. However, the storage node contact holes are almost inevitably misaligned with the self-aligned contact pads. As a result, the first insulating interlayer 30 is almost inevitably etched when the storage node contact holes are formed, causing further damage to active regions 10a.

Interconnection contact hole 50 is typically formed in core and peripheral region "B" at the same time when bit line contact holes 45 are formed in cell region "A". Unfortunately, however, as the integration density of core and peripheral region "B" increases, interconnection contact hole 50 tends to expose more than just junction region 25b. For instance, interconnection contact hole 50 may expose parts of gate electrode structure 20.

Consequently, spacers 19 and hard mask layer 18 may be partially lost during the formation of interconnection contact hole 50. As a result, gate electrode material 17 may be exposed and may be short-circuited by a conductive material formed later in interconnection contact hole 50.

To solve these problems, some conventional memory devices interpose etch stoppers between first insulating layer 30 and second insulating interlayer 40 to prevent first insulating interlayer 30 from being etched when bitline contact holes 45 are formed. A conventional memory device employing this technique is disclosed, for example, in U.S. Pat. No. 6,787,906 (the '906 patent).

In the '906 patent, etch stoppers are formed on first insulating layer 30. Accordingly, bitline contact holes 45 and storage node contact holes can be formed without further etching first insulating layer 30. However, the etch stoppers are also formed in core and peripheral region "B", making it difficult to form interconnection contact hole 50. Since interconnection contact hole 50 penetrates first and second insulating layers 30 and 40, if the etch stoppers are interposed between first and second insulating interlayers 30 and 40, it is difficult to expose junction region 25b.

SUMMARY OF THE INVENTION

According to one embodiment of the invention, a semiconductor memory device comprises a semiconductor substrate in which a cell region and a core and peripheral region are defined, isolation layers formed in the semiconductor substrate to define active regions therein, and a first gate electrode structure formed in the cell region and a second gate electrode structure formed in the core and peripheral region. The semiconductor memory device further comprises source and drain regions formed in the active regions on respective sides of each of the gate electrode structures, self-aligned contact pads contacting the source and drain regions in the cell region, an insulating interlayer formed on the semiconductor substrate between the self-aligned contact pads, and etch stoppers formed on the insulating interlayer in the cell region between the self-aligned contact pads. Typically, the memory device further comprises top spacers formed on upper sidewalls of the second gate electrode structure.

According to another embodiment of the invention, a method of manufacturing a semiconductor memory device comprises forming an insulating interlayer on a semiconductor substrate having conductive regions, forming contact pads in the insulating interlayer so that the contact pads contact the conductive regions, removing a predetermined thickness of the insulating interlayer to partially expose sidewalls of the contact pads, and forming etch stoppers in spaces created by the removal of the predetermined thickness of the insulating interlayer.

According to still another embodiment of the present invention, method of manufacturing a semiconductor memory device comprises forming gate electrode structures in a semiconductor substrate in which a cell region and a core and peripheral region are defined and isolation layers are formed to define active regions, and forming source and drain regions in the active regions on respective sides of each of the gate electrode structures. The method further comprises forming an insulating interlayer on the semiconductor substrate over the source and drain regions, etching the insulating interlayer to expose source and drain regions in the cell region, forming self-aligned contact pads in the insulating interlayer so that the self-aligned contact pads contact the exposed source and drain regions, removing a predetermined thickness of the insulating interlayer, forming etch stoppers in spaces created by removing the predetermined thickness of the insulating interlayer in the cell region, and forming top spacers on upper sidewalls of the gate electrode structure in the core and peripheral region.

BRIEF DESCRIPTION OF THE DRAWINGS

The invention is described below in relation to several embodiments illustrated in the accompanying drawings. Throughout the drawings, like reference numbers indicate like exemplary elements, components, or steps, and the dimensions of layers and elements may be exaggerated for clarity. In the drawings.

DETAILED DESCRIPTION OF THE INVENTION

Exemplary embodiments of the invention are described below with reference to the corresponding drawings. These embodiments are presented as teaching examples. The actual scope of the invention is defined by the claims that follow.

FIGS. 2A through 2E are cross-sectional views illustrating a method of manufacturing a semiconductor memory device according to an embodiment of the present invention.

Figure 2A:
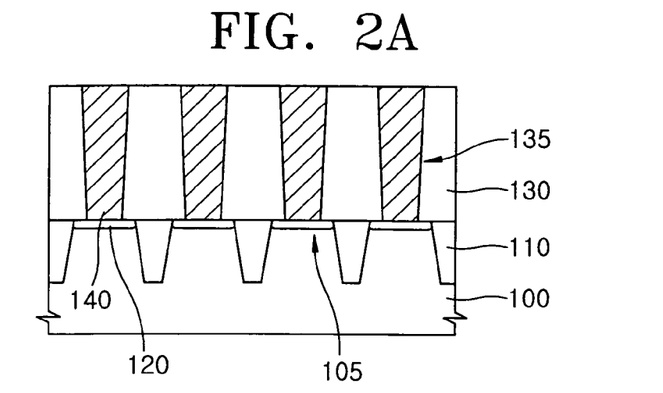
FIGS. 2A through 2E are cross-sectional views illustrating a method of manufacturing a semiconductor memory device according to an embodiment of the present invention.

Referring to FIG. 2A, isolation layers 110 are formed in predetermined portions of a semiconductor substrate 100 to define active regions 105. Isolation layers 110 are typically formed by shallow trench isolation (STI). A conductive region 120 is formed in each active region 105 between isolation layers 110. Conductive regions 120 are typically formed by implanting impurities in semiconductor substrate 100. A first insulating interlayer 130 comprising silicon oxide is formed on semiconductor substrate 100. First insulating interlayer 130 is then etched to form contact holes 135 exposing conductive regions 120. A conductive layer such as a doped polysilicon layer, is then deposited on first insulating interlayer 130 to fill first contact holes 135. The conductive layer is planarized by a chemical mechanical polishing (CMP) process or an etch-back process to expose a surface of first insulating interlayer 130, thereby forming contact pads 140.

Figure 2B:
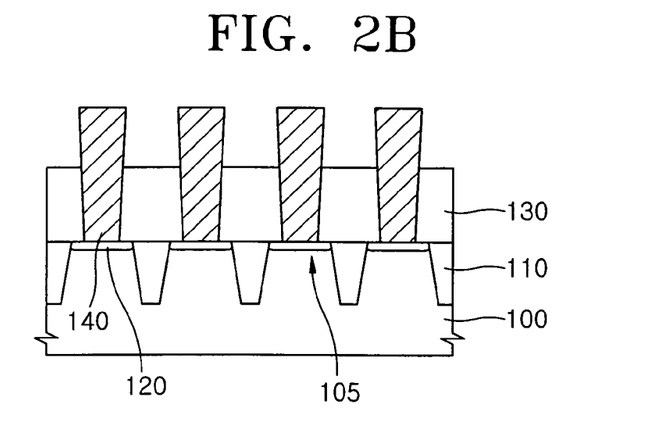

Referring to FIG. 2B, a predetermined thickness of first insulating interlayer 130 is removed to partially expose sidewalls of contact pads 140. The predetermined thickness of first insulating interlayer 130 is typically removed using a wet etch-back process, and the thickness of first insulating interlayer 130 is generally reduced thereby by between 1/10 and 1/2 of its original thickness.

Figure 2C:
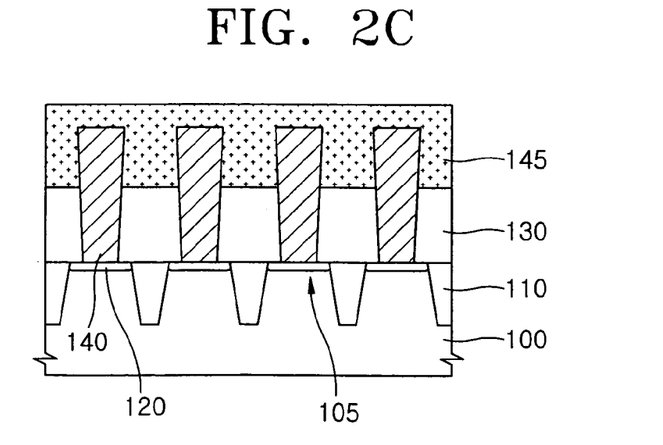

Referring to FIG. 2C, an etch stopper 145 is deposited on first insulating interlayer 130 and contact pads 140. Etch stopper 145 is deposited to substantially fill spaces generated between contact pads 140 when first insulating interlayer 130 is removed. Etch stopper 145 has an etch selectivity relative to first insulating interlayer 130 and typically comprises a silicon nitride (SiN) layer or a silicon nitroxide (SiON) layer. Alternatively, etch stopper 145 could comprise any insulating layer having an etch selectivity relative to first insulating interlayer 130 (silicon oxide) and contact pads 140.

Figure 2D:
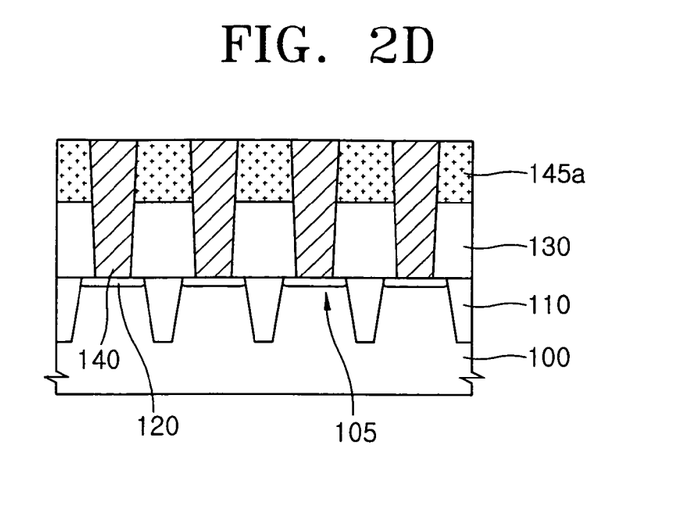

Referring to FIG. 2D, etch stopper 145 is planarized by etch back or CMP until contact pads 140 are opened, thereby forming etch stoppers 145a between contact pads 140.

Figure 2E:
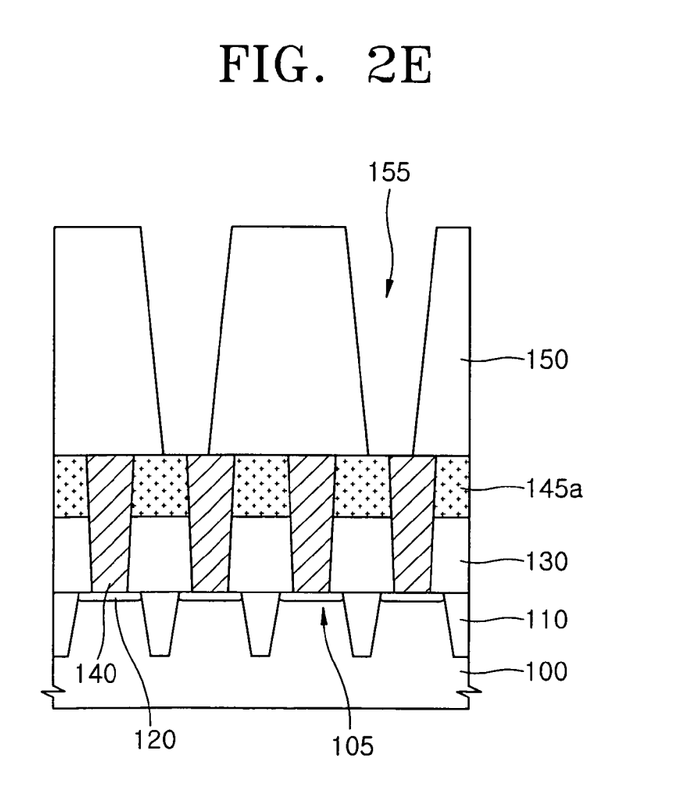

Referring to FIG. 2E, a second insulating interlayer 150 is formed on contact pads 140 and etch stoppers 145a. Second insulating interlayer 150 typically comprises a silicon oxide layer like first insulating interlayer 130. Second insulating interlayer 150 is selectively etched to form second contact holes 155 exposing contact pads 140. Second contact holes 155 are shown to be misaligned with contact pads 140. However, since etch stoppers 145a are formed between second insulating interlayer 150 and first insulating interlayer 130, first insulating interlayer 130 is not further etched, and active regions 105 are undamaged.

Figure 3:
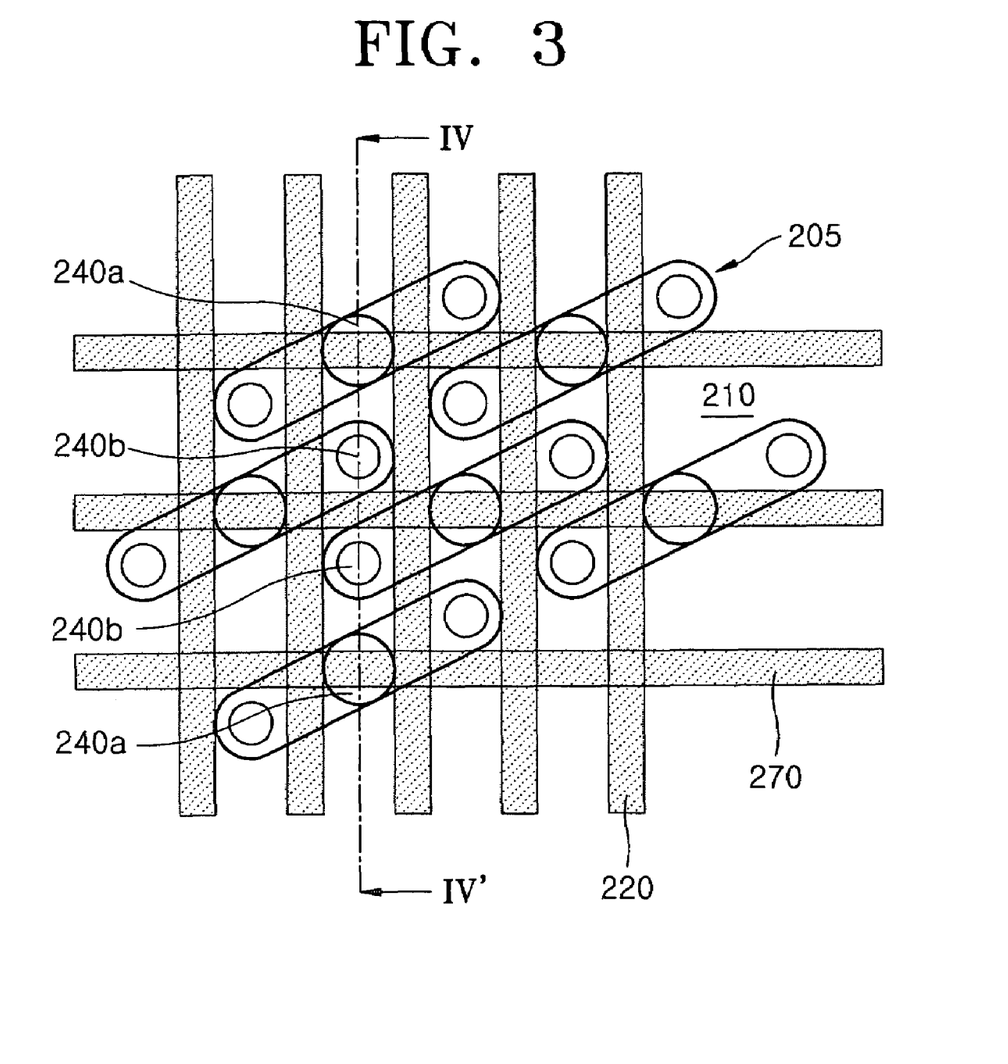
FIG. 3 is a plan view of a cell region of a dynamic random access memory (DRAM) device according to an embodiment of the present invention.

FIG. 3 is a plan view of a cell region "A" in a DRAM device according to an embodiment of the present invention and FIGS. 4A through 4E are cross-sectional views taken along a line IV-IV' in FIG. 3. In contrast to FIG. 3, FIGS. 4A through 4E also illustrate a core and peripheral region "B" of the DRAM device. FIGS. 4A through 4E illustrate a method of manufacturing a semiconductor memory device according to another embodiment of the present invention.

Figure 4A:
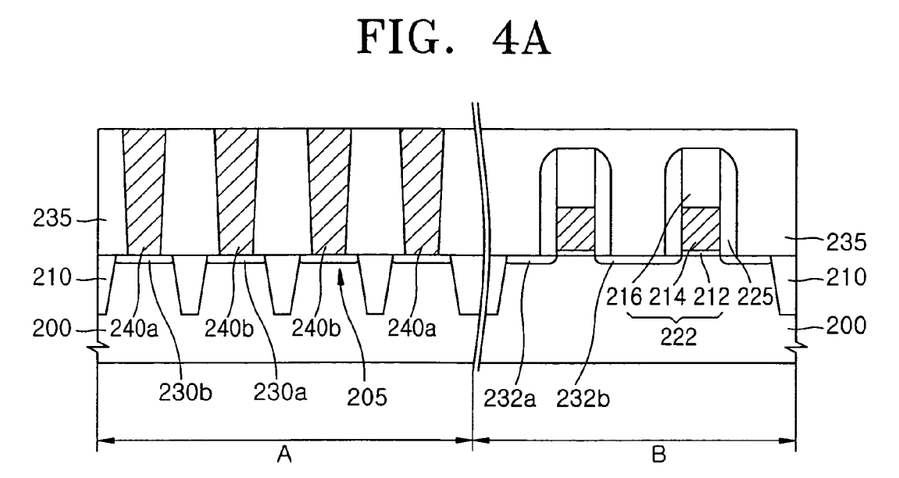
FIGS. 4A through 4E are cross-sectional views illustrating a method of manufacturing a semiconductor memory device according to another embodiment of the present invention.

Referring to FIGS. 3 and 4A, isolation layers 210 are formed in a semiconductor substrate 200 where cell region "A" and core and peripheral region "B" are defined. Isolation layers 210 define active regions 205. A gate oxide layer 212, a conductive layer 214 for a gate electrode, and a hard mask layer 216 are then sequentially stacked on semiconductor substrate 200, and then stacked layers 212, 214, and 216 are partially patterned. Gate spacers 225 are formed on sidewalls of patterned hard mask layer 216 and conductive layer 214 using a well-known method, thereby forming gate electrode structures 220 and 222. Gate spacers 225 typically comprise silicon nitride layers like hard mask layer 216. Gate electrode structure 220 in cell region "A" typically acts as a word line structure.

Impurities are implanted into active regions 205 outside gate electrode structures 220 and 222 to form source/drain regions 230a and 230b and 232a and 232b. A first insulating interlayer 235 is then formed to a predetermined thickness on semiconductor substrate 200. Next, first insulating interlayer 235 is etched to expose source and drain regions 230a and 230b in cell region "A". Here, source and drain regions 230a and 230b are formed in a self-aligned manner by gate electrode structure 220 surrounded by hard mask layer 216 and gate spacers 225. Next, a conductive layer, such as a doped polysilicon layer, is deposited on first insulating interlayer 235 to contact source/drain regions 230a and 230b. The conductive layer is then planarized by an etch back process or a CMP process to form self-aligned contact pads 240a and 240b. Self-aligned contact pads 240a will contact later formed bitline contact pads and self-aligned contact pads 240b will contact later storage node contact pads.

Figure 4B:
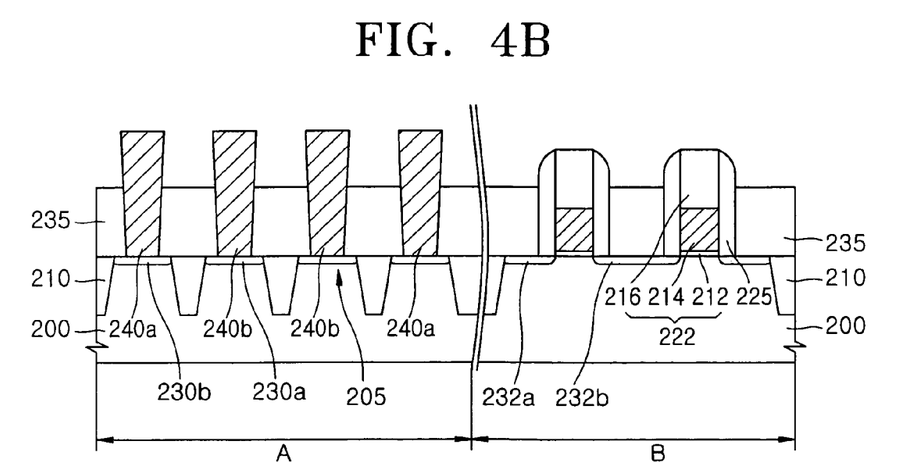

Referring to FIG. 4B, a predetermined thickness of the first insulating interlayer 235 is removed. The thickness of first insulating interlayer 235 is typically reduced by a range of between 1/10 and 1/2 of its original thickness. As first insulating interlayer 235 is partially removed, sidewalls of the self-aligned contact pads 240a and 240b are partially exposed. In addition, as first insulating interlayer 235 is partially removed, a top surface of gate electrode structure 222 and sidewalls of gate spacers 225 in core and peripheral region "B" are partially exposed.

Figure 4C:
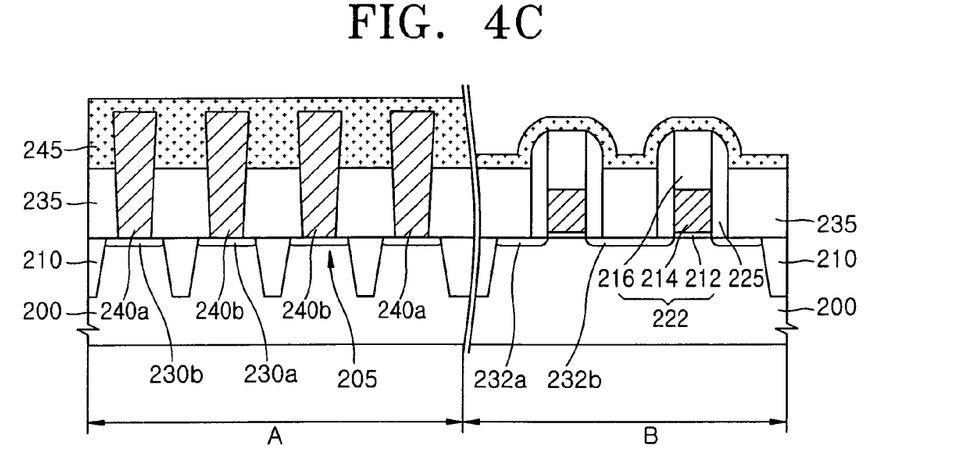

Referring to FIG. 4C, an insulating layer 245 for an etch stopper is deposited on semiconductor substrate 200 to fill spaces between self-aligned contact pads 240a and 240b. Insulating layer 245 typically comprises a silicon nitride layer having an etch selectivity relative to first insulating interlayer 235. When an 80 nm design rule is used, a distance between self-aligned contact pads 240a and 240b is approximately 50 nm. The spaces between self-aligned contact pads 240a and 240b can be filled by depositing insulating layer 245 to a thickness of about 300 Å.

Figure 4D:
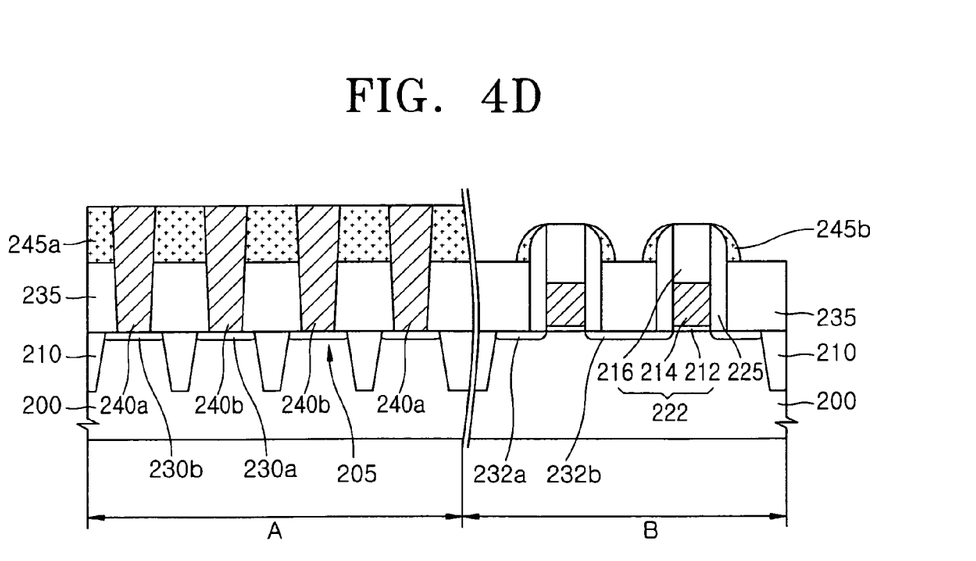

Referring to FIG. 4D, insulating layer 245 is anisotropically etched to form etch stoppers 245a between self-aligned contact pads 240a and 240b in cell region "A". Top spacers 245b are formed on upper sidewalls of exposed portions of gate spacers 225 in core and peripheral region "B". Accordingly, etch stoppers 245a can be selectively formed only in cell region "A" without an additional photolithography process.

Figure 4E:
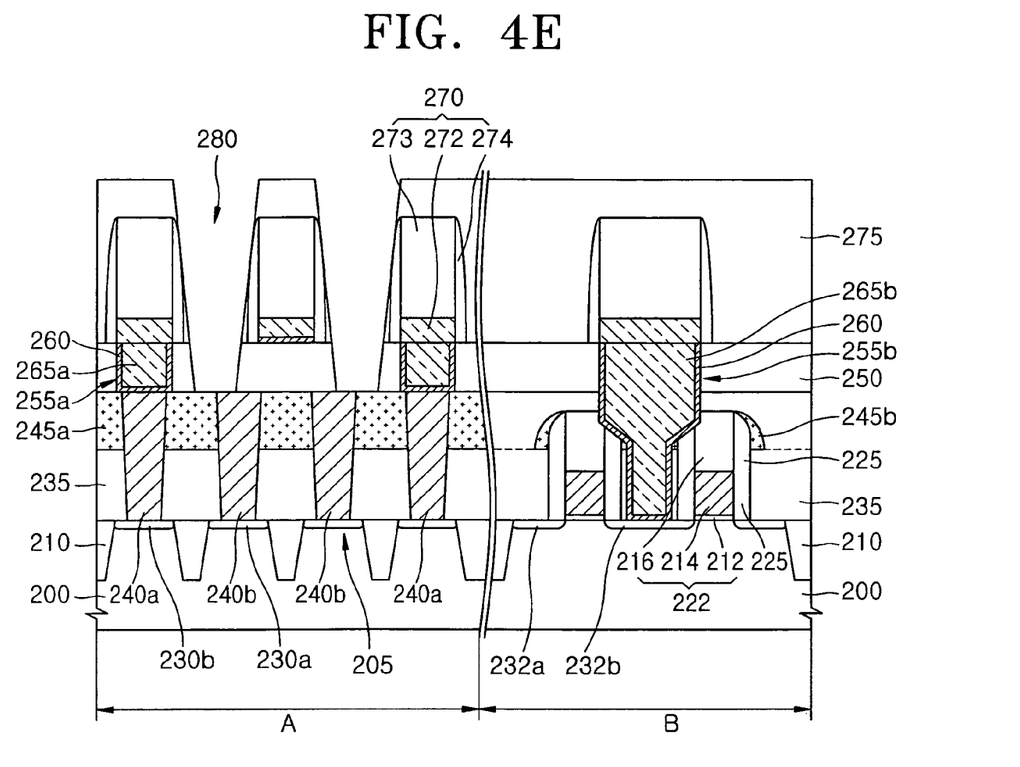

Referring to FIG. 4E, a second insulating interlayer 250 is deposited on the semiconductor substrate 200 over etch stoppers 245a and top spacers 245b. Next, second insulating interlayer 250 is etched to expose self-aligned contact pads 240a in cell region "A" and source/drain region 232b in core and peripheral region "B", thereby forming bitline contact holes 255a and an interconnection contact hole 255b in second insulating interlayer 250.

Even though misalignment occurs when bitline contact holes 255a are formed, since etch stoppers 245a are formed on both sides of self-aligned contact pads 240a, first insulating interlayer 235 and active regions 205 are prevented from being etched. In addition, since top spacers 245b are formed outside gate spacers 225 in core and peripheral region "B", the total loss of gate spacers 225 and hard mask layer 216 is prevented when interconnection contact hole 255b is formed.

Subsequently, a barrier metal layer 260 is formed on inner surfaces of bitline contact holes 255a, an inner surface of interconnection contact hole 255b, and a top surface of second insulating interlayer 250. Thereafter, a conductive layer such as a tungsten layer is deposited on barrier metal layer 260 to fill bitline contact holes 255a and interconnection contact hole 255b. Next, the conductive layer and barrier metal layer 260 are planarized by CMP process or an etch back process to expose a surface of second insulating interlayer 250, thereby forming bitline contact pads 265a and an interconnection contact pad 265b.

A conductive layer 272 for a bitline and a hard mask layer 273 are deposited on the second insulating interlayer 250 where bitline contact pads 265a and interconnection contact pad 265b are formed. Next, hard mask layer 273 and conductive layer 272 are patterned to contact bitline contact pads 265a and interconnection contact pad 265b, and alternate with gate electrode structure 220 in cell region "A". Bitline spacers 274 are formed on sidewalls of patterned hard mask layer 273 and conductive layer 272, thereby forming bitline structures 270.

A third insulating interlayer 275 is deposited on semiconductor substrate 200 over bitline structures 270. Subsequently, third insulating interlayer 275 and second insulating interlayer 250 are etched to expose self-aligned contact pads 240b, thereby forming storage node contact holes 280. Storage node contact holes 280 formed between bitline structures 270 are typically separated from bitline structures 270 by a predetermined distance for insulation purposes. Since self-aligned contact pads 240b have a diameter similar to that of storage node contact holes 280, misalignment occurs inevitably. However, since etch stoppers 245a are formed between self-aligned contact pads 240a and 240b, first insulating interlayer 235 is prevented from being lost even though the misalignment occurs. Although not shown, a conductive layer is formed in storage node contact holes 280 to form storage node contact pads (not shown).

As described above, after self-aligned contact pads 240b are formed in cell region "A", etch stoppers 245a are selectively buried on both sides of self-aligned contact pads 240b to form bitline contact holes 255a and storage node contact holes 280. Consequently, the loss of the insulating interlayer due to misalignment during the formation of the contact holes is prevented, thereby preventing damage to the active regions.

Further, since the etch stoppers are only formed in the cell region without a separate photolithography process, a difficult etching process due to the forming of the interconnection contact hole in the core and peripheral region is avoided.

Furthermore, since the top spacers are formed on the sidewalls of the gate electrode in the core and peripheral region when the etch stoppers are selectively formed, gate electrode material is prevented from being exposed when the interconnection contact hole is formed.

The foregoing preferred embodiments are teaching examples. Those of ordinary skill in the art will understand that various changes in form and details may be made to the exemplary embodiments without departing from the scope of the present invention as defined by the following claims.

What is claimed:

1. A semiconductor memory device, comprising:
   a semiconductor substrate in which a cell region and a core and peripheral region are defined;
   isolation layers formed in the semiconductor substrate to define active regions therein;
   a first gate electrode structure formed in the cell region and a second gate electrode structure formed in the core and peripheral region, wherein each one of the first and second gate electrode structures comprises a conductive layer and a gate spacer formed on sidewalls of the conductive layer;
   source/drain regions formed in the active regions on respective sides of each of the first and second gate electrode structures;

self-aligned contact pads formed though an insulating interlayer formed on the semiconductor substrate to contact a source/drain region in the cell region;

etch stoppers formed on the insulating interlayer and interposed between the self-aligned contact pads in the cell region; and top spacers formed on at least sidewalls of the gate spacers of the second gate electrode structure, wherein respective bottom surfaces of the etch stoppers and the to spacers are coplanar.

2. The semiconductor memory device of claim 1, wherein each one of the first and second gate electrode structures further comprises a gate oxide and a hard mask layer, wherein the conductive layer is formed on the gate oxide, the hard mask layer is formed on the conductive layer, and the gate spacers are formed on sidewalls of the conductive layer and the hard mask layer.

3. The semiconductor memory device of claim 2, wherein the top spacers and the etch stoppers are formed from the same material layer.

4. The semiconductor memory device of claim 3, wherein the material layer is a silicon nitride layer.

5. The semiconductor memory device of claim 1, further comprising:
a bitline structure formed on an upper surface of the etch stoppers and an upper surface of the self-aligned contact pads.

6. The semiconductor memory device of claim 5, wherein the upper surface of the etch stoppers and the upper surface of the self-aligned contact pads are coplanar.

7. A semiconductor memory device comprising:
a semiconductor substrate in which a cell region and a core and peripheral region are defined;
isolation layers formed in the semiconductor substrate to define active regions therein;
a first gate electrode structure formed in the cell region and a second gate electrode structure formed in the core and peripheral region, wherein each one of the first and second gate electrode structures comprises a gate oxide formed on the semiconductor substrate, a conductive layer formed on the gate oxide, a hard mask layer formed on the conductive layer, and gate spacers formed on sidewalls of the conductive layer and the hard mask layer;
source/drain regions formed in the active regions on respective sides of each of the first and second gate electrode structures;
self-aligned contact pads formed though an insulating interlayer formed on the semiconductor substrate to respectively contact a source/drain region in the cell region;
etch stoppers formed on the insulating interlayer and interposed between the self-aligned contact pads, wherein an upper surface of the etch stoppers is coplanar with an upper surface of the self-aligned contact pads; and
top spacers formed on at least sidewalls of the gate spacers of the second gate electrode structure,
wherein respective bottom surfaces of the etch stoppers and the top spacers are coplanar.

8. The semiconductor memory device of claim 7, wherein the top spacers and the etch stoppers are formed from the same material layer.

9. The semiconductor memory device of claim 8, wherein the material layer is a silicon nitride layer.

10. The semiconductor memory device of claim 7, further comprising:
a bitline structure formed on an upper surface of the etch stoppers and an upper surface of the self-aligned contact pads.

11. A semiconductor memory device, comprising:
a substrate comprising a cell region and a core and peripheral region;
a first gate electrode structure formed in the cell region and a second gate electrode structure formed in the core and peripheral region, wherein each one of the first and second gate electrode structures comprises a conductive layer and gate spacers formed on sidewalls of the conductive layer;
source/drain regions formed in the substrate on respective sides of the first and second gate electrode structures;
a plurality of self-aligned contact pads, each extending through a first insulating layer formed on the substrate and an etch stopper layer formed on the first insulating layer to respectively contact a source/drain region in the cell region, such that lower portions of adjacent ones of the plurality of self-aligned contact pads are separated by the first insulating layer and upper portions of the plurality of self-aligned contact pads are separated by the etch stopper layer, wherein an upper surface for the etch stopper layer and an upper surface of the plurality of self-aligned contact pads are coplanar;
a bitline structure formed on the upper surface of the etch stopper layer and the upper surface of the plurality of self-aligned contact pads; and
top spacers formed on at least sidewalls of the gate spacers of the second ate electrode structure,
wherein respective bottom surfaces of the etch stopper layer and the top spacers are coplanar.

12. The semiconductor memory device of claim 11, wherein each one of the first and second gate electrode structures further comprises a gate oxide and a hard mask layer, wherein the gate oxide is formed on the semiconductor substrate, the conductive layer is formed on the gate oxide, the hard mask layer is formed on the conductive layer, and the gate spacers are formed on sidewalls of the conductive layer and the hard mask layer.

13. The semiconductor memory device of claim 12, further comprising:
a second insulating layer formed on the upper surface of the etch stopper layer and the upper surface of the plurality of self-aligned contact pads in the cell region and on the top spacers in the core and peripheral region;
bitline contact pads formed through the second insulating layer in the cell region and interconnection contact pads formed in the core and peripheral region;
a third insulating layer formed on the second insulating layer and over the bitline structure.

14. The semiconductor memory device of claim 13, further comprising:
a plurality of storage node contact holes formed through the third insulating layer to expose the upper surface of the etch stopper layer and the upper surface of the plurality of self-aligned contact pads.

* * * * *